(12) United States Patent
Kendrick et al.

(10) Patent No.: US 6,810,366 B2
(45) Date of Patent: Oct. 26, 2004

(54) METHOD AND APPARATUS FOR FILTERING A SIGNAL USING A DEADBAND

(75) Inventors: Larry E. Kendrick, Peoria, IL (US); Samir Med Kherat, Peoria, IL (US); Muhammed Were, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 242 days.

(21) Appl. No.: 10/105,470

(22) Filed: Mar. 25, 2002

(65) Prior Publication Data

US 2003/0182088 A1 Sep. 25, 2003

(51) Int. Cl.$^7$ ............................................. G06F 15/00
(52) U.S. Cl. ...................................... 702/190; 702/189
(58) Field of Search ...................... 324/76.11; 327/100, 327/261, 355, 361, 555; 702/127, 138, 142, 150, 151, 166, 173, 189, 190

(56) References Cited

U.S. PATENT DOCUMENTS

| | | | |
|---|---|---|---|
| 3,571,578 A | * | 3/1971 | Fry .............................. 700/37 |
| 3,803,357 A | * | 4/1974 | Sacks ......................... 381/94.8 |
| 3,857,104 A | * | 12/1974 | Sacks .......................... 327/552 |
| 4,375,599 A | * | 3/1983 | Bleckmann et al. ........ 327/102 |
| 4,478,068 A | | 10/1984 | Bonitz et al. |
| 4,485,649 A | * | 12/1984 | Martin et al. ................. 72/13.3 |
| 4,556,956 A | * | 12/1985 | Dickenson et al. ........... 700/42 |
| 4,637,247 A | | 1/1987 | Dreyer et al. |
| 4,730,499 A | * | 3/1988 | Gianella et al. .............. 73/861 |
| 4,852,657 A | * | 8/1989 | Hardy et al. ..................... 172/2 |
| 4,935,682 A | * | 6/1990 | McCuen ...................... 318/586 |
| 4,940,929 A | * | 7/1990 | Williams .................... 323/222 |
| 4,954,732 A | * | 9/1990 | Surauer et al. .............. 327/552 |
| 5,029,118 A | | 7/1991 | Nakajima et al. |
| 5,040,119 A | * | 8/1991 | Hardy et al. .................. 701/50 |
| 5,343,843 A | | 9/1994 | Hamren |
| 5,400,644 A | | 3/1995 | Remboski, Jr. et al. |
| 5,444,579 A | | 8/1995 | Kline et al. |
| 5,576,962 A | * | 11/1996 | Ferguson et al. ........... 701/101 |
| 5,747,681 A | | 5/1998 | Kuroka et al. |
| 5,781,048 A | * | 7/1998 | Nakao et al. ................ 327/157 |
| 5,838,599 A | * | 11/1998 | Tao et al. .................... 708/304 |
| 5,873,427 A | * | 2/1999 | Ferguson et al. ........... 180/178 |
| 5,901,059 A | * | 5/1999 | Tao et al. ...................... 700/29 |
| 5,939,881 A | | 8/1999 | Slater et al. |
| 5,949,677 A | * | 9/1999 | Ho .............................. 700/80 |
| 5,966,684 A | | 10/1999 | Richardson et al. |

(List continued on next page.)

OTHER PUBLICATIONS

Hui, K; Chan, C; "Stabilization of Systems with Deadzone Nonlinearity"; IEEE Int'l Conference on Control Applications;Vol 2; Sep. 1–4, 1998; pp 1036–1040.*

(List continued on next page.)

*Primary Examiner*—John Barlow
*Assistant Examiner*—Douglas N Washburn
(74) *Attorney, Agent, or Firm*—Clifton Green

(57) ABSTRACT

The present invention provides apparatuses and methods for filtering a signal. A first processing device receives a first control signal and a first feedback signal and transmits a first error signal as a function of those signals. A second processing device receives the first error signal and transmits a second control signal as a function of the first error signal, a deadband, and a gain factor. A third processing device receives the second control signal and the first feedback signal and transmits an output signal as a function of those signals. A fourth processing device receives the output signal and transmits the first feedback signal as a function of the output signal to the first processing device and the third processing device, the first feedback signal being substantially equal to the output signal delayed by a first predetermined duration of time.

18 Claims, 4 Drawing Sheets

U.S. PATENT DOCUMENTS

| | | | |
|---|---|---|---|
| 5,978,084 A | | 11/1999 | Blake |
| 6,006,153 A | | 12/1999 | Stander et al. |
| 6,055,016 A | | 4/2000 | Darden et al. |
| 6,120,663 A | * | 9/2000 | Kato et al. ................... 204/401 |
| 6,278,914 B1 | | 8/2001 | Gaudreau et al. |
| 6,317,676 B1 | * | 11/2001 | Gengler et al. ................ 701/82 |
| 6,540,148 B1 | * | 4/2003 | Salsbury et al. ........... 236/1 EA |

OTHER PUBLICATIONS

Cranshaw, S; Vinnicombe, G; "Local Stability Properties of Systems with Saturation and Deadzone Nonlinearities"; IEEE Conference on Decision and Control; Vol 1; Dec. 16–18, 1998; pp 897–902.*

Corrandini, M; Leo, T; Orlando, G; "Robust Stabilization of Systems with Actuator Nonlinearities";IEEE Int'l Symposium on Industrial Electronics; Vol 1; Jul. 12–16, 1999; pp 327–330.*

Bu, F; Yao, B; "Nonlinear Adaptive Robust Control of Hydraulic Actuators Regulated by Proportional Directional Control Valves with Deadband and Nonlinear Flow Gains"; Proce dings of American Control Conference 2000; Vol 6; Jun. 2000; pp 4129–4133.*

Recker, D; Kokotovic, P; Rhode, D; Winkelman, J; "Adaptive Nonlinear Control of Systems Containing a Deadzone"; $30^{th}$ IEEE Conference on Decision and Control; Dec. 1991; pp 2111–2115.*

Tao, G; Kokotovic, P; "Continuous–Time Adaptive Control of Systems with Unknown Backlash";IEEE Transactions on Automatic Control; Vol 40, Issue 6; Jun. 1995; pp 1083–1087.*

Tao, G; Kokotovic, P; "Adaptive Control of System with Unknown Output Backlash"; IEEE Transactions on Automatic Control; vol 40, Issue 2; Feb. 1995; pp 326–330.*

Ezai, K; Tao, G; Kokotovic, P; "Optimal Control of Tracking Systems with Backlash and Flexibility"; $36^{th}$ IEEE Conferenc on Decision and Control; Vol 2; Dec. 1997; pp 1749–1754.*

* cited by examiner

Fig_2_

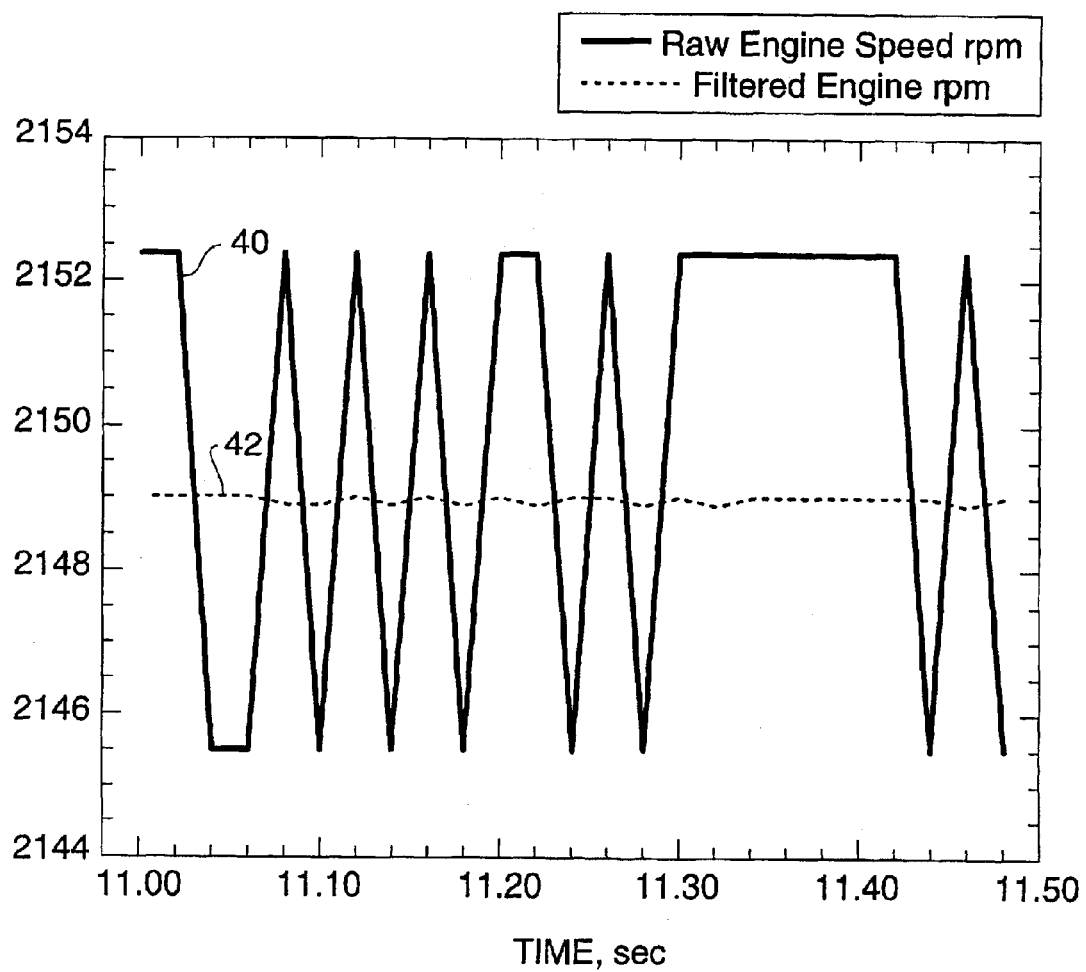

METHOD AND APPARATUS FOR FILTERING A SIGNAL USING A DEADBAND

TECHNICAL FIELD

This invention relates generally to signal processing, and more particularly, to low pass filtering using a deadband.

BACKGROUND

Conventional low pass filters using resistors and capacitors work quite well in many, but not all, applications. In some instances, the inherent phase shift of the input signal causes a delay that is significant enough to cause problems.

For example, in many engine applications, a sensor detects the rotational speed or position of the engine and transmits a signal indicative thereof. FIG. 1 is a graph showing one example of an engine speed signal 10 transmitted from such a sensor. The engine was set to run at 2140 revolutions per minute (rpm) plus or minus 4 rpm. Thus, the portion of the engine speed signal 10 outside this range is noise, which may be filtered out to some extent by a conventional low pass filter.

FIG. 2 shows a graph of a modeled engine speed signal 12 of 2149 rpm plus or minus 3 rpm (generated by a frequency generator) transmitted from the engine speed sensor, along with a filtered version (an output signal 14) created by filtering the modeled engine speed signal 12 with a conventional (5 Hz) resistor/capacitor type low pass filter. As you can see, the modeled engine speed signal 12 contains portions having an amplitude outside of the 2149 plus or minus 3 rpm, which is noise. While the conventional low pass filter reduces the noise so that the amplitude of the output signal 14 is within the expected parameters (2149 plus or minus 3 rpm), the output signal 14 is delayed (phase shifted) by approximately 50 msec from the input signal.

In engine applications, it is not unusual for the conventional low pass filter to cause a phase shift of 100 msec. This is problematic in that, depending on the application, the engine speed signal may be read every 20 msec. Thus, the conventional low pass filter may process the input signal more slowly than is desired.

SUMMARY OF THE INVENTION

The present invention provides apparatuses and methods for filtering a signal. A first processing device receives a first control signal and a first feedback signal. The first processing device transmits a first error signal as a function of the first control signal and the first feedback signal. A second processing device is coupled with the first processing device to receive the first error signal. The second processing device transmits a second control signal as a function of the first error signal, the second control signal being substantially indicative of zero when the absolute value of the first error signal is less than or equal to a first predetermined value, substantially indicative of the first error signal value minus the first predetermined value, multiplied by a second predetermined value, when the absolute value of the first error signal is greater than the first predetermined value, and the first error signal is greater than the first predetermined value, and substantially indicative of the first error signal value plus the first predetermined value, multiplied by the second predetermined value, when the absolute value of the first error signal is greater than the first predetermined value, and the first error signal is not greater than the first predetermined value.

A third processing device is coupled with the second processing device to receive the second control signal and the first feedback signal. The third processing device transmits an output signal as a function of the second control signal and the first feedback signal. A fourth processing device is coupled with the third processing device to receive the output signal. The fourth processing device transmits the first feedback signal as a function of the output signal to the first processing device and the third processing device, the first feedback signal being substantially equal to the output signal delayed by a first predetermined duration of time.

BRIEF DESCRIPTION OF THE DRAWINGS

FIG. 4 shows a graph of a modeled engine speed signal along with a filtered version of the same signal using the apparatus according to one embodiment of the invention.

DETAILED DESCRIPTION

Figure 1:
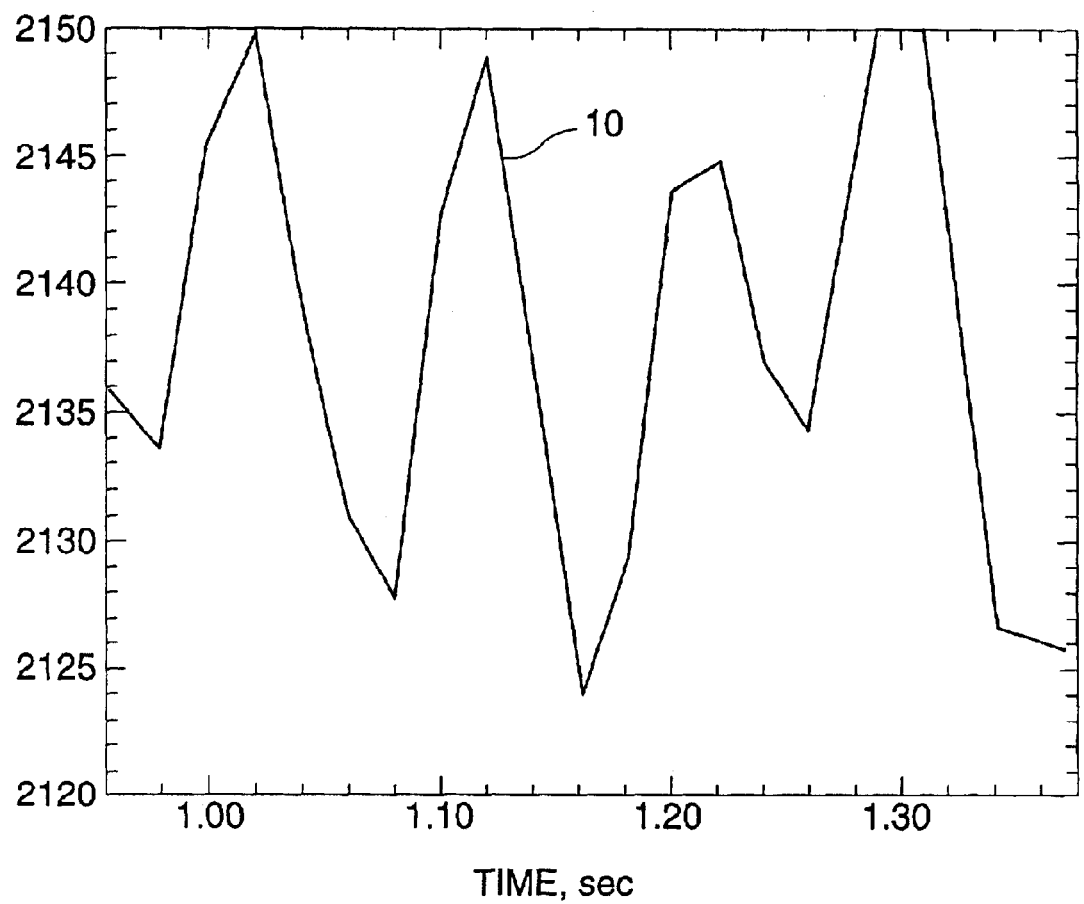
FIG. 1 is a graph showing one example of an engine speed signal transmitted from an engine speed sensor.
Figure 2:
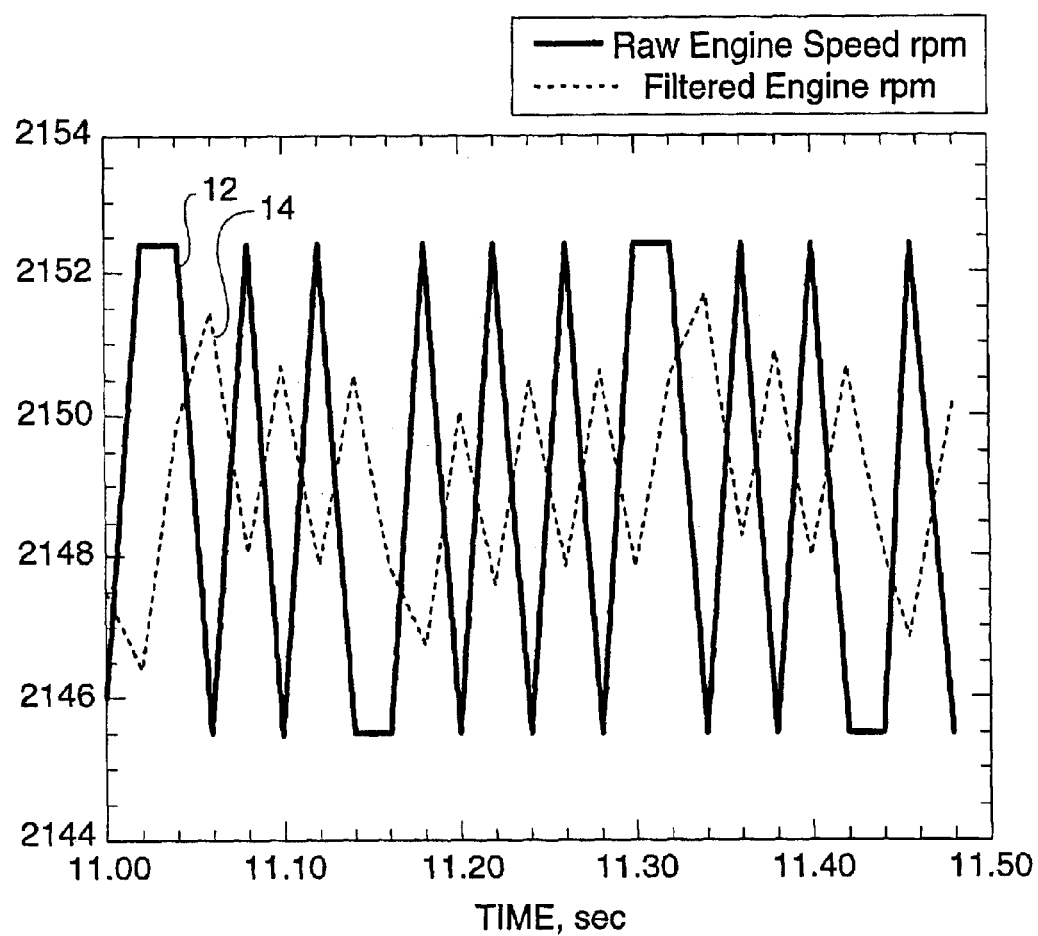
FIG. 2 shows a graph of a modeled engine speed signal along with a filtered version of the same signal using a conventional low pass filter.
Figure 3:
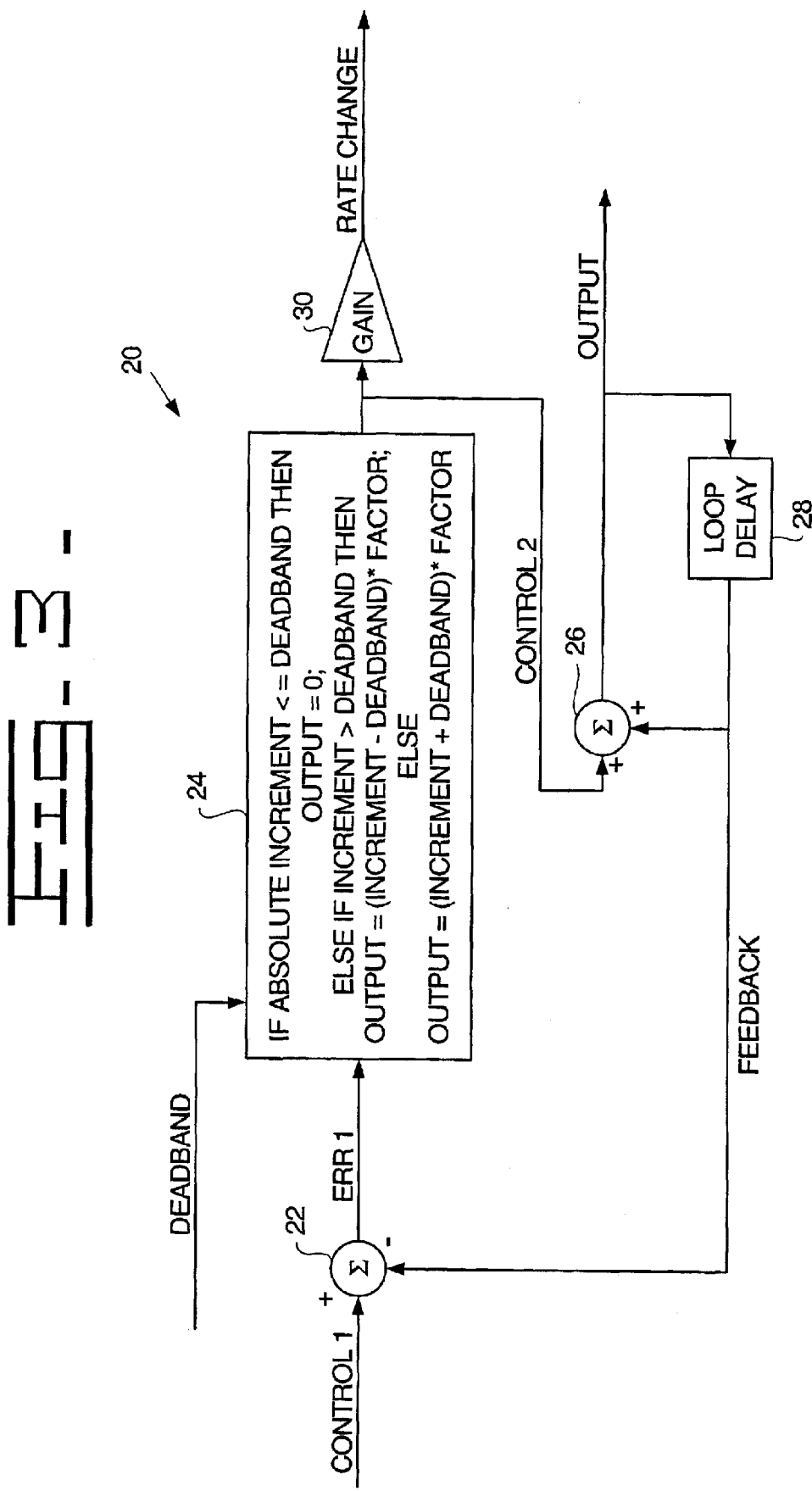
FIG. 3 shows a block diagram of an apparatus according to one embodiment of the invention.

FIG. 3 shows a block diagram of an apparatus 20 according to one embodiment of the invention. An input signal, such as a first control signal CONTROL1 to be filtered is received by a first processing device, such as a summer 22. The summer 22 also receives a second signal, such as a first feedback signal FEEDBACK1 (discussed below). The summer 22 transmits a first error signal ERR1 as a function of the first control signal CONTROL1 and the first feedback signal FEEDBACK1 by ways known to those skilled in the art.

Typically the first error signal will be indicative of the difference between the first control signal CONTROL1 and the first feedback signal FEEDBACK1. Thus, even though the summer 22 shows the first feedback signal FEEDBACK1 being subtracted from the first control signal CONTROL1, the reverse could also be used.

A second processing device, such as a deadband processor 24 receives the first error signal ERR1 and transmits a second control signal CONTROL2 as a function of the first error signal ERR1. In one embodiment of the invention, the deadband processor 24 transmits a zero (or substantially zero) as the second control signal CONTROL2 when the absolute value of the first error signal ERR1 is less than or equal to a first predetermined value (the deadband).

In embodiments of the invention, the noise on the first control signal CONTROL1 may be measured or otherwise determined, such as by testing in a controlled known situation, and the first predetermined value (deadband) selected to be slightly less than one half (½) of the peak-to-peak amplitude of the noise signal at a steady state estimate of the device transmitting the first control signal CONTROL1. This value is generally easy to determine by subtracting the minimum value of the signal from its maximum value. In the case of a real-time signal the maximum and minimum value may be continuously updated by ways known to those skilled in the art. The variation is typically within certain limits that are predictable from sampled data.

In other embodiments of the invention the deadband may not be continuously updated. For example, a deadband may be selected based on an expected level of noise and programmed into the deadband processor 24. Although a deadband equal to slightly less than one half of the peak-to-peak amplitude is disclosed above, other values of the deadband may be chosen depending, for example, on the desired filtering to be performed by the apparatus 20.

When the absolute value of the first error signal ERR1 is greater than the deadband, the deadband processor 24 typically uses one of two types of algorithms:

1. If the first error signal is positive, indicating that the first control signal CONTROL1 is greater than the first feedback signal FEEDBACK, the deadband processor 24 transmits the value of the first error signal ERR1 minus the deadband, multiplied by a gain factor as the second control signal CONTROL2.

2. If the first error signal is negative, indicating that the first control signal CONTROL1 is less than the first feedback signal, the deadband processor 24 transmits the value of the first error signal ERR1 plus the deadband, multiplied by the gain factor as the second control signal CONTROL2.

The gain factor may be any of a variety of appropriate values depending on the desired response of the apparatus 10. In one embodiment of the invention, a value of approximately 0.9 was used. In other embodiments, different numbers may be appropriate, or the gain factor may be excluded, or have a value of 1 (the functional equivalent of excluding the gain factor).

A second summer 26 receives the second control signal CONTROL2 and also receives the first feedback signal FEEDBACK and transmits an output signal OUTPUT as a function thereof. Typically the second summer 26 adds the values of the two signals together.

A loop delay 28 receives the output signal OUTPUT, and transmits the output signal OUTPUT delayed by a predetermined amount of time as the first feedback signal FEEDBACK. The amount of the delay may vary depending on the application of the apparatus 20, although a delay of one (1) processing cycle is used in some embodiments of the invention. A processing cycle may be thought of as the amount of time it takes for the apparatus 20 to receive a discrete first control signal CONTROL1 and to transmit its corresponding output signal OUTPUT.

Thus, the output signal OUTPUT may be thought of as the sum of the last commanded output signal plus a desired change (the second control signal CONTROL2).

In some embodiments of the invention, the second control signal CONTROL2 may be used as an indicator of the rate of change of the output signal OUTPUT. The second control signal CONTROL2 may be received by a gain 30 that transmits a ratechange signal RATECHANGE as a function thereof. Typically the ratechange signal RATECHANGE is equal to the second control signal CONTROL2 multiplied by some predetermined factor. The predetermined factor may be chosen depending on the use of the ratechange signal RATECHANGE by any downstream device.

FIG. 4 shows a graph of a modeled engine speed signal 40 along with a filtered version 42 of the same signal using the apparatus 20 according to one embodiment of the invention. A modeled engine speed signal 40 equal to 2149 plus or minus 3 rpm was input to the apparatus 20 as the first control signal CONTROL1. Noise on the signal occurred naturally due to configuration of the equipment. The filtered signal 42 was transmitted as the output signal by the apparatus 20, using a deadband of 3.2 rpm and a gain factor of approximately 0.9.

The apparatus 20 may be implemented in hardware, software, and firmware, or some combination thereof by ways known to those skilled in the art.

INDUSTRIAL APPLICABILITY

The apparatus 20 may be used in a variety of applications where filtering is desired without a phase shift or delay. For example, the apparatus 20 may be used to filter the engine speed signal of an internal combustion engine, thus providing a more accurate signal of the actual engine speed in a more timely manner. Further, the apparatus 20 may also provide the ratechange signal RATECHANGE, which may be used in a variety of ways known to those skilled in the art, such as in the derivative portion of a Proportional Integral Derivative (PID) controller.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for filtering a signal, comprising:

a first processing device operable to receive a first control signal and a first feedback signal, the first processing device operable to transmit a first error signal as a function of the first control signal and the first feedback signal;

a second processing device coupled with the first processing device to receive the first error signal, the second processing device operable to transmit a second control signal as a function of the first error signal, the second control signal being substantially indicative of zero when the absolute value of the first error signal is less than or equal to a first predetermined value, substantially indicative of the first error signal value minus the first predetermined value, multiplied by a second predetermined value, when the absolute value of the first error signal is greater than the first predetermined value, and the first error signal is greater than the first predetermined value, and substantially indicative of the first error signal value plus the first predetermined value, multiplied by the second predetermined value, when the absolute value of the first error signal is greater than the first predetermined value, and the first error signal is not greater than the first predetermined value; a third processing device coupled with the second processing device to receive the second control signal and the first feedback signal, the third processing device operable to transmit an output signal as a function of the second control signal and the first feedback signal wherein the output signal has substantially zero phase shift;

and a fourth processing device coupled with the third processing device to receive the output signal, the fourth processing device operable to transmit the first feedback signal as a function of the output signal to the first processing device and the third processing device, the first feedback signal being substantially equal to the output signal delayed by a first predetermined duration of time.

2. The apparatus of claim 1 wherein the first processing device comprises a summer.

3. The apparatus of claim 1 wherein the first error signal is substantially indicative of the difference between the first control signal and the first feedback signal.

4. The apparatus of claim 1 wherein the first predetermined value comprises a deadband.

5. The apparatus of claim 1 wherein the second predetermined value comprises a gain factor.

6. The apparatus of claim 1 wherein the second control signal is indicative of a rate of change of the output control signal.

7. The apparatus of claim 1 wherein the third processing device comprises a summer.

8. The apparatus of claim 1 wherein the output signal is substantially indicative of the sum of the first control signal and the first feedback signal.

9. The apparatus of claim 1 wherein the fourth processing device comprises a loop delay.

10. The apparatus of claim 1 wherein the first predetermined duration of time comprises substantially a duration of time equal to one cycle of the second processing device.

11. The apparatus of claim 1, further comprising a fifth processing device coupled with the second processing device to receive the second control signal, the fifth processing device operable to transmit a rate of change signal indicative of the rate of change of the output signal as a function of the second control signal.

12. The apparatus of claim 11 wherein the rate of change signal substantially comprises the second control signal multiplied by a second predetermined value.

13. The apparatus of claim 1 wherein the first, second, third, and fourth processing devices comprise at least one of hardware and software.

14. A method for filtering a signal, comprising:

determining a first control signal;

determining a first feedback signal as a function of an output signal, the first feedback signal being substantially equal to the output signal delayed by a first predetermined duration of time;

determining a first error signal as a function of the first control signal and the first feedback signal;

determining a second control signal as a function of the first error signal, the second control signal being substantially:
  a) zero when the absolute value of the first error signal is less than or equal to a first predetermined value,
  b) indicative of the first error signal minus the first predetermined value, multiplied by a second predetermined value, when the absolute value of the first error signal is greater than the first predetermined value, and the first error signal is greater than the first predetermined value, and
  c) indicative of the first error signal plus the first predetermined value, multiplied by the second predetermined value, when the absolute value of the first error signal is greater than the first predetermined value, and the first error signal is not greater than the first predetermined value;

determining the output signal as a function of the second control signal and the first feedback signal wherein the output signal has substantially zero phase shift;

and transmitting the output signal.

15. The method of claim 14 wherein the first error signal substantially comprises the difference between the first control signal and the first feedback signal.

16. The method of claim 14 wherein the first predetermined period of time is substantially equal to the amount of time used to update the second control signal.

17. The method of claim 14 wherein the first predetermined value is substantially indicative of a desired deadband.

18. The method of claim 14 wherein the output signal substantially comprises the sum of the second control signal and the first feedback signal.

* * * * *